United States Patent
Farrar et al.

(10) Patent No.: US 6,316,356 B1
(45) Date of Patent: *Nov. 13, 2001

(54) THERMAL PROCESSING OF METAL ALLOYS FOR AN IMPROVED CMP PROCESS IN INTEGRATED CIRCUIT FABRICATION

(75) Inventors: Paul A. Farrar, So. Burlington, VT (US); John H. Givens, Meridian, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,252

(22) Filed: Mar. 10, 1998

(51) Int. Cl.$^7$ .................................................. H01L 21/44
(52) U.S. Cl. ........................... 438/660; 438/633; 438/658; 438/688
(58) Field of Search .................................. 438/597, 660, 438/661, 658, 687, 688, 633

(56) References Cited

U.S. PATENT DOCUMENTS

| | | | |
|---|---|---|---|
| 3,561,954 | 2/1971 | Brook | 75/142 |
| 4,393,096 | 7/1983 | Gajda et al. | 427/90 |
| 4,595,429 | 6/1986 | LeCaer et al. | 148/403 |
| 5,071,791 | 12/1991 | Inoue et al | 437/203 |
| 5,205,770 | 4/1993 | Lowrey et al. | 445/24 |
| 5,229,316 | 7/1993 | Lee et al. | 437/67 |
| 5,300,155 | 4/1994 | Sandhu et al. | 148/33 |
| 5,354,712 | 10/1994 | Ho et al. | 437/195 |
| 5,395,801 | 3/1995 | Doan et al. | 437/225 |
| 5,409,563 | 4/1995 | Cathey | 156/643 |
| 5,416,045 | 5/1995 | Kauffman et al. | 437/174 |
| 5,497,017 | 3/1996 | Gonzales | 257/306 |
| 5,527,561 | 6/1996 | Dobson et al. | 427/383 |
| 5,641,545 | 6/1997 | Sandhu | 427/573 |
| 5,644,166 | 7/1997 | Honeycutt et al. | 257/754 |
| 5,814,557 * | 9/1998 | Venkatraman et al. | 438/622 |
| 5,994,221 | 11/1999 | Kizilyalli et al. | 438/688 |
| 6,017,144 | 1/2000 | Guo et al. | 364/468 |
| 6,090,710 * | 7/2000 | Andricaces et al. | 438/687 |
| 6,110,829 | 8/2000 | Besser et al. | 438/688 |

FOREIGN PATENT DOCUMENTS

| | | |
|---|---|---|
| 1211563 | 11/1970 | (GB) . |
| 60-187654A | 9/1985 | (JP) . |
| 61-159545A | 7/1986 | (JP) . |
| 63-179041A | 7/1988 | (JP) . |

OTHER PUBLICATIONS

Zolotorevskii, V.S., et al., "The effect of Mg +Si and Mg +Ge addns. on the structure and mech. properties of Al–Cu alloys after aging at 170 degrees", *Izv. Vyssh. Uchebn. Zaved., Tsvetn. Metall.,* 5, Abstract only, (1983).

Kaanta, C., et al., "Dual Damascene: A ULSI Wiring Technology", *VMIC Conference,* 144–152, (Jun. 1991).

Licata, T., et al., "Dual Damascene AL Wiring for 256M DRAM", *VMIC Conference,* 596–602, (Jun. 1995).

* cited by examiner

*Primary Examiner*—Caridad Everhart
(74) *Attorney, Agent, or Firm*—Schwegman, Lundberg, Woessner & Kluth, P.A.

(57) ABSTRACT

A thermal processing method is described which improves integrated circuit metal polishing and increases conductivity following polish. A method of fabricating a metal layer in an integrated circuit is described which comprises the steps of depositing a layer of metal alloy which contains alloy dopant precipitates, and performing a first anneal of the integrated circuit to drive the alloy dopants into solid solution. The metal is quenched to prevent the alloy dopants from coming out of solution prior to removing excess metal alloy with a polish process. To improve conductivity after polishing, the dopants are allowed to come out of solution. The metal alloy is described as aluminum with alloy dopants of silicon and copper where the first anneal is performed at 400 to 500° C. This process is particularly applicable to fabrication of interconnects formed using a dual damascene process. The integrated circuit is described as any circuit, but can be a memory device such as a DRAM.

31 Claims, 3 Drawing Sheets

THERMAL PROCESSING OF METAL ALLOYS FOR AN IMPROVED CMP PROCESS IN INTEGRATED CIRCUIT FABRICATION

TECHNICAL FIELD OF THE INVENTION

The present invention relates generally to integrated circuits and in particular the present invention relates to thermal processing for an improved CMP process.

BACKGROUND OF THE INVENTION

As the density of semiconductor devices continues to increase, the need for smaller interconnections also increases. Historically, the semiconductor industry has used a subtractive etching process to pattern metal interconnect layers of the semiconductor. This metal processing technique, however, has limitations including poor step coverage, non-planarity, shorts and other fabrication problems. To address these problems, a dual damascene technique has been developed. This process, as explained in "Dual Damascene: A ULSI Wiring Technology", Kaanta et al., 1991 *VMIC Conference,* 144–150 (Jun. 11–12, 1991) and incorporated herein by reference, involves the deposition of a metal into contact vias and conductor trenches which are patterned in the semiconductor. The semiconductor is then subjected to a known CMP (chemically-mechanically polish) process to both planarize the semiconductor and remove excess metal from all but the patterned areas.

The metal layer can be fabricated using known CVD (chemical vapor deposition) or PVD (physical vapor deposition) techniques. The metal interconnects are typically an aluminum alloys containing dopants, such as silicon and copper. These dopants are Si and Cu precipitates which tend to migrate to the grain boundaries of the aluminum during deposition. The precipitates are harder than aluminum. Thus, they are hard to dissolve and remove during the CMP process. The precipitates also contribute to defects in the aluminum, such as scratches, which materialize during the CMP process. These problems are present in all CMP processes, and not limited to removing metal alloys used in a dual damascene process.

For the reasons stated above, and for other reasons stated below which will become apparent to those skilled in the art upon reading and understanding the present specification, there is a need in the art for a process of fabricating metal alloy interconnects in an integrated circuit which improves a CMP process and reduces defects experienced during CMP.

SUMMARY OF THE INVENTION

The above-mentioned problems with integrated circuit fabrication and other problems are addressed by the present invention, and will be understood by reading and studying the following specification. A thermal processing method is described which improves metal polishing and increases conductivity following polish.

In particular, the present invention describes a method of fabricating a metal layer in an integrated circuit. The method comprises depositing a layer of metal alloy which contains alloy dopant precipitates, performing a first anneal of the integrated circuit to drive the alloy dopants into solid solution, and quenching the integrated circuit to prevent the alloy dopants from coming out of solution. Excess metal alloy is then removed using a polish process, and a second anneal is performed after the excess metal alloy is removed to allow the dopants to come out of solution and increase a conductivity of the metal alloy.

In another embodiment, a method of improving a chemical-mechanical polish (CMP) process in an integrated circuit is provided. The method comprises annealing the integrated circuit prior to performing the chemical-mechanical polish process to drive alloy dopants into solid solution, and annealing the integrated circuit after performing the chemical-mechanical polish process to drive alloy dopants out of solid solution.

DETAILED DESCRIPTION OF THE INVENTION

Figure 1A:
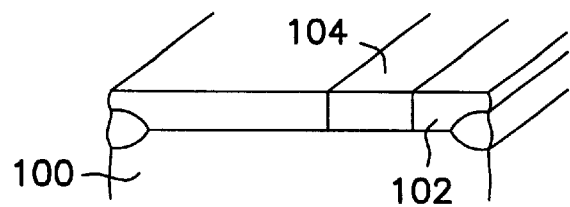
FIGS. 1A–1E are an illustration of a dual damascene fabrication technique according to the present invention.
Figure 1B:
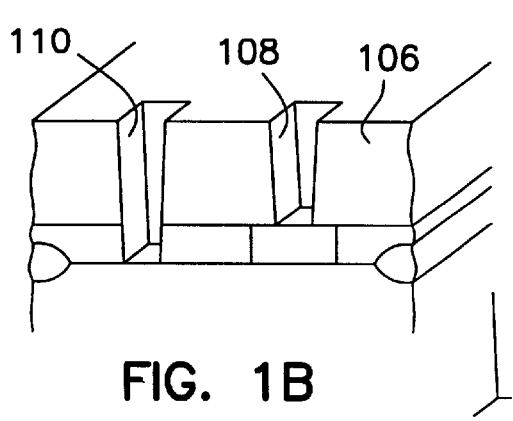
Figure 1D:
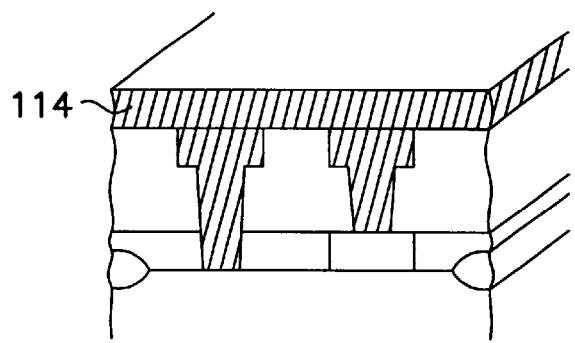
Figure 1C:
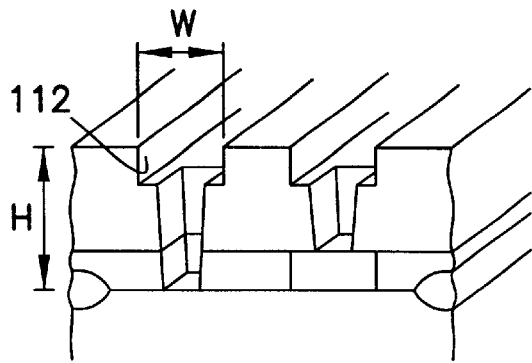
Figure 1E:
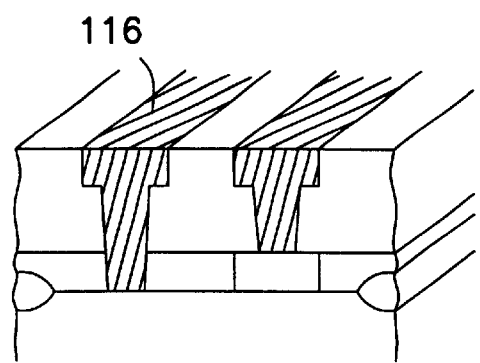

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Prior to describing the process of the present invention, a description of the fabrication of metal conductor and contacts using a dual damascene process is provided. Referring to FIGS. 1A–E, a semiconductor base layer 100 is fabricated with an insulator layer 102, such as an oxide layer. The base layer is typically silicon having regions which are either p-type or n-type doped. A conductive area 104 is provided above the base layer. This conductive region can be any type of conductor or semiconductor, such as polysilicon, metal or doped silicon. A second layer of insulator material 106 is fabricated on top of the first insulator layer. Using known pattern and etch techniques, a contact via 108, or opening, is formed to access conductor area 104. A contact via 110 is also formed to access base layer 100. The vias may be tapered and are intended to provide access to any region or material which is desired to be coupled to a conductor interconnect.

Conductor interconnect trenches 112 are patterned and etched into the dielectric layer 106. After the trenches and access vias are formed, a layer of metal 114 (and necessary barrier metallurgy) is deposited on the device. A physical vapor deposition technique, known to those skilled in the art, is used to fill the features and provide a layer of metal on top of layer 106. As known to those skilled in the art, a CMP process is implemented to remove excess metal from the top surface of the structure and provide defined interconnect lines 116.

In other integrated circuit fabrication processes (i.e., not dual damascene fabrication), the CMP step is provided to polish and planarize the integrated circuit wafer. The present invention improves the CMP process by providing a more uniform metal alloy for polishing.

During the metal deposition process, an aluminum alloy is deposited on the integrated circuit wafer along with dopants, such as copper and silicon. Aluminum has been typically used due to its low resistance and good adhesion to $SiO_2$ and Si. Silicon is usually added as an alloying element to alleviate junction spiking in Al contacts to Si. Further, electromigration and hillocks (spike-like formations) can be reduced by adding Cu, Ti, Pd or Si to aluminum to form alloys. These alloying elements precipitate at the grain boundaries. Thus, the grain boundaries are "plugged" and vacancy migration is inhibited.

The present invention is applicable to any precipitated material, but is particularly applicable to Al—Cu—Si alloys. In particular, Al—Cu, Al—Si and Cu—Si precipitates located at grain boundaries are not easily removed using standard CMP processes. This is primarily due to the hardness of the precipitates. Further, if a relatively large grouping of precipitates are experienced, damage in the form of scratches can occur to the aluminum interconnects during CMP.

Improved Interconnect Fabrication

The present invention provides a uniform metal alloy prior to performing a CMP process. That is, the metal layer is annealed in a conventional 400–500° C. furnace to drive the precipitates dopants back into solution (i.e., a solid state reaction to force the Cu and Si to go back into solution). The wafer is then quenched to prevent formation of precipitate by driving the dopants out of solution. The result is a more uniform alloy material which can be more easily processed using known CMP techniques.

An undesirable side effect of annealing and quenching the alloy is a higher resistance of the interconnect. That is, the dopants are occupying states of the aluminum which causes interference in the flow of electrons across the metal. To reduce the resistance of the metal interconnects, the wafer is thermally soaked (i.e., 150–200° C. anneal) such that the dopants form a second phase and then precipitate out, mainly at the grain boundaries. The reliability of the interconnect metal is also increased by reducing the electron drift which is enhanced by the presence of Si and Cu in solution. The two step thermal process is provided to both enhance the CMP process by providing a uniform alloy prior to CMP, and to improve the reliability and conductivity of the alloy after CMP by driving the dopants out of solution. Although some post-metal deposition annealing has been used in the past, the annealing is performed after a metal etch step to heal any plasma related damage which may be formed during fabrication and to react Al with underlaying layers to improve adhesion and electrical conductivity to underlying structures, not to enhance a subsequent CMP process.

Figure 2:
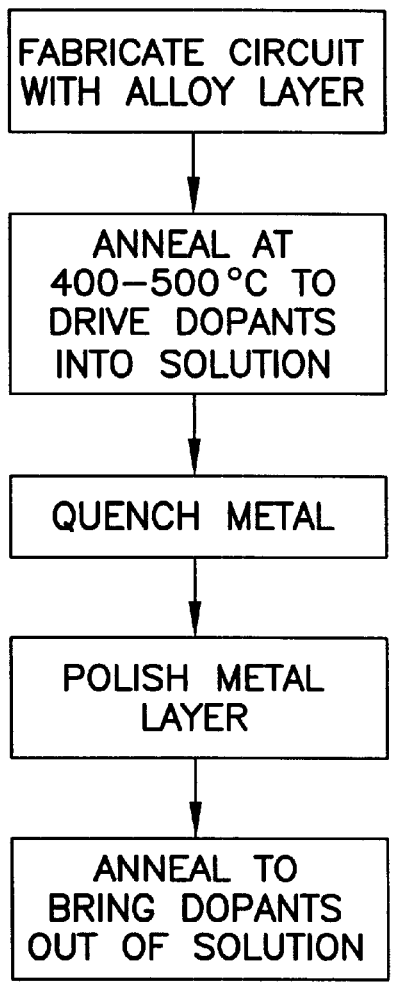
FIG. 2 illustrates the basic process flow of the present metallurgy technique.

While the anneal ranges 400–500° C. and 150–250° C. are intended for aluminum based alloys, the key is to provide a solid state reaction to drive precipitates into solution prior to a polish step. See FIG. 2 for an illustration of the basic process flow of the present metallurgy technique. An integrated circuit is first fabricated with a layer of metal alloy which contains alloy dopant precipitates. The integrated circuit is annealed at 400 to 500° C. to drive the dopants into solid solution. The integrated circuit is then quenched, using any known technique such as quenching in ambient air, to prevent the dopants from coming out of solution. The integrated circuit is then processed to remove excess metal alloy. It is preferred to use a chemical-mechanical polish process to remove the metal. After the circuit has been polished, a second anneal is performed at a lower temperature to allow the dopants to come out of solution. The conductivity of the metal alloy is thereby increased.

Figure 3:
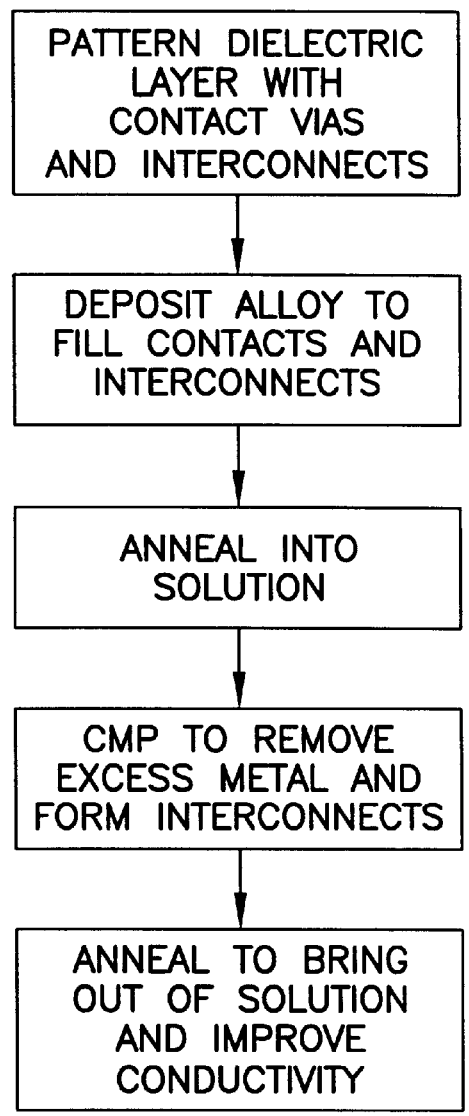
FIG. 3 illustrates in more detail the dual damascene process of the present invention.

FIG. 3 illustrates in more detail the dual damascene process of the present invention. A semiconductor base layer is fabricated with an insulator layer, such as an oxide layer. Using known pattern and etch techniques, contact vias are formed to access to any region or material which is desired to be coupled to a conductor interconnect. Conductor interconnect trenches are also patterned and etched into the dielectric layer. After the trenches and access vias are formed, a layer of metal alloy (and necessary barrier metallurgy) is deposited on the device. The integrated circuit is annealed at 400 to 500° C. to drive the dopants into solid solution. The integrated circuit is then quenched, using any known technique such as quenching in ambient air, to prevent the dopants from coming out of solution. A CMP process is implemented to remove excess metal from the top surface of the structure and provide defined interconnect lines. After the circuit has been polished, a second anneal is performed at a lower temperature to allow the dopants to come out of solution. The conductivity of the metal alloy is thereby increased. It should be noted that the low temperature heat treatment is required to be performed only once. This process should be done after the last high temperature process.

Memory Device

Figure 4:
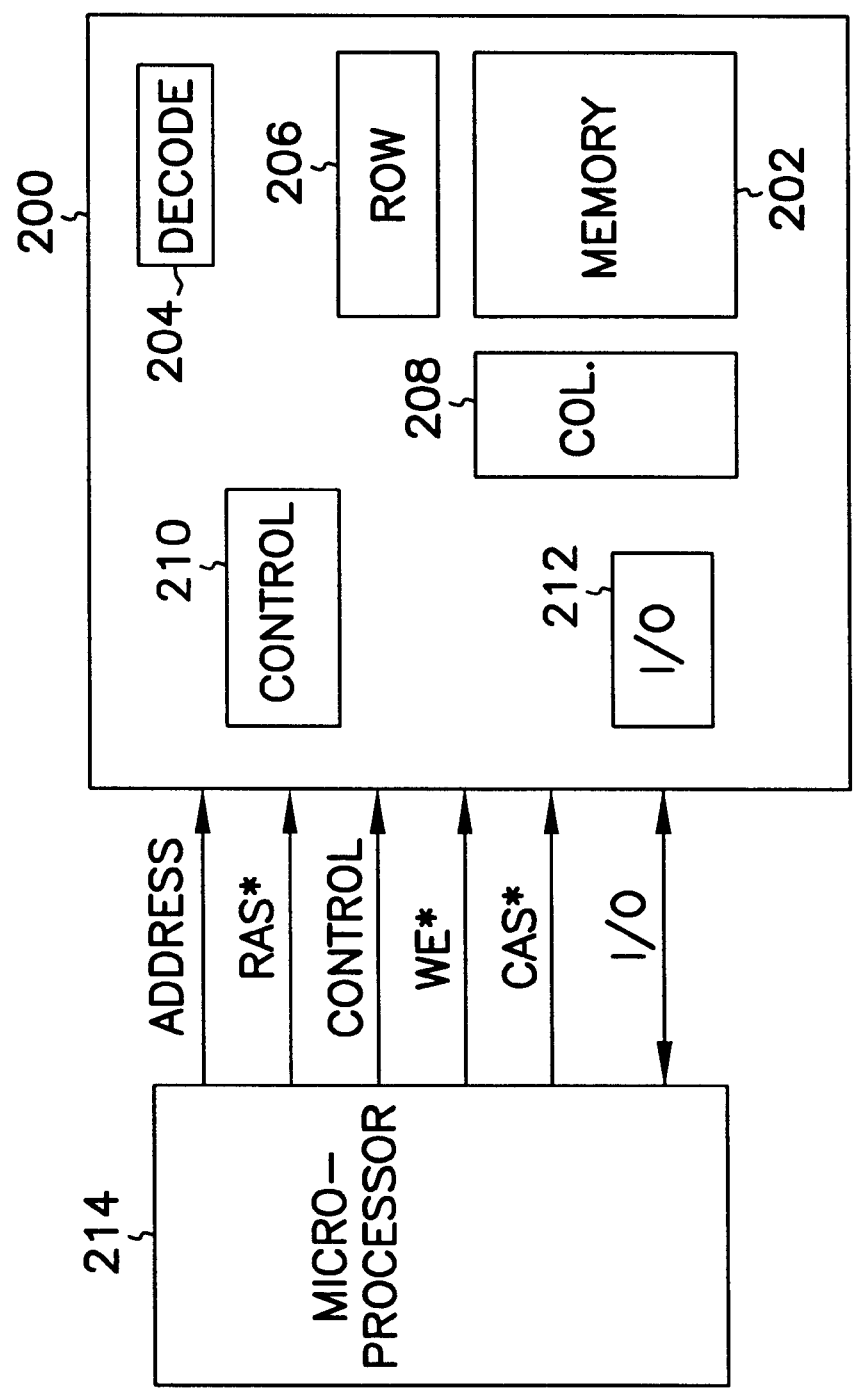
FIG. 4 is a block diagram of a memory device fabricated according to the present invention.

FIG. 4 is a simplified block diagram of a memory device according to one embodiment of the present invention. The memory device 200 includes an array of memory cells 202, address decoder 204, row access circuitry 206, column access circuitry 208, control circuitry 210, and Input/Output circuit 212. The memory can be coupled to an external microprocessor 214, or memory controller for memory accessing. The memory receives control signals from the processor 214, such as WE*, RAS* and CAS* signals. The memory is used to store data which is accessed via I/O lines. It will be appreciated by those skilled in the art that additional circuitry and control signals can be provided, and that the memory device of FIG. 4 has been simplified to help focus on the present invention. Thus, the memory includes internal circuitry and metal contacts and interconnects which are coupled to the memory array and internal circuitry. The metal contacts and interconnects are formed with an alloy of aluminum. The metal contacts and interconnects are formed by annealing the memory at a temperature sufficient to drive alloy dopants into solid solution prior to polishing the memory device to remove portions of a metal layer and form the metal contacts and interconnects. Specifically, a layer of metal alloy is deposited which contains alloy dopant precipitates. A first anneal of the memory is performed to drive the alloy dopants into solid solution. The memory is then quenched to prevent the alloy dopants from coming out of solution prior to removing excess metal alloy using a polish process. A second anneal of the memory is performed after the excess metal alloy is removed to allow the dopants to come out of solution and increase a conductivity of the metal alloy.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Conclusion

A thermal processing method has been described which improves metal polishing and increases conductivity following polish. A method of fabricating a metal layer in an integrated circuit has also been described. The method comprises the steps of depositing a layer of metal alloy which contains alloy dopant precipitates, performing a first anneal of the integrated circuit to drive the alloy dopants into solid solution, and quenching the integrated circuit to prevent the alloy dopants from coming out of solution. Excess metal alloy is then removed using a polish process, and a second anneal is performed after the excess metal alloy is removed to allow the dopants to come out of solution and increase a conductivity of the metal alloy. The metal alloy can be aluminum with alloy dopants of silicon and copper where the first anneal is performed at 400 to 500° C. This process is particularly applicable to fabrication of interconnects formed using a dual damascene process. The integrated circuit has been described as any circuit, but can be a memory device such as a DRAM.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating a metal layer in an integrated circuit, the method comprising:
   depositing a layer of metal alloy which contains alloy dopant precipitates;
   performing a first anneal of the integrated circuit to drive the alloy dopants into solid solution;
   quenching the integrated circuit to prevent the alloy dopants from coming out of solution;
   removing excess metal alloy using a polish process; and
   performing a second anneal after the excess metal alloy is removed to allow the dopants to come out of solution and increase a conductivity of the metal alloy.

2. The method of claim 1 wherein the first anneal is performed at 400 to 500° C.

3. The method of claim 1 wherein the metal alloy comprises aluminum with alloy dopants of silicon and copper.

4. The method of claim 1 wherein the second anneal is performed at 150 to 250° C.

5. The method of claim 1 further comprising:
   forming vias and interconnect trenches in the integrated circuit prior to depositing the layer of metal alloy; and
   wherein the polish process removes excess metal alloy to define metal interconnect lines.

6. A method of fabricating a metal layer in an integrated circuit, the method comprising:
   forming vias and interconnect trenches in the integrated circuit;
   depositing a layer of metal alloy which contains alloy dopant precipitates on the integrated circuit to fill the vias and interconnect trenches;
   performing a first anneal of the integrated circuit at 400 to 500° C. to drive the alloy dopants into solid solution;
   quenching the integrated circuit to prevent the alloy dopants from coming out of solution;
   removing excess metal alloy using a chemical-mechanical polish process;
   performing a second anneal at 150 to 250° C. after the excess metal alloy is removed to allow the dopants to come out of solution and increase a conductivity of the metal alloy.

7. The method of claim 6 wherein the metal alloy comprises aluminum with alloy dopants of silicon and copper.

8. Method of improving a chemical-mechanical polish (CMP) process in an integrated circuit, the method comprises annealing the integrated circuit prior to performing the chemical-mechanical polish process to drive alloy dopants into solid solution, quenching the integrated circuit, and annealing the integrated circuit after performing the chemical-mechanical polish process to drive alloy dopants out of solid solution.

9. The method of claim 8 wherein the anneal prior to the chemical-mechanical polish process is performed at approximately 400 to 500° C.

10. The method of claim 8 wherein the anneal after the chemical-mechanical polish is performed at approximately 100 to 250° C.

11. The method of claim 8 wherein the integrated circuit comprises an aluminum based alloy.

12. The method of claim 11 wherein the aluminum based alloy comprises Al, Cu and Si.

13. A method of polishing an aluminum based alloy in an integrated circuit, the method comprises:
   performing a first anneal operation on the integrated circuit at a temperature sufficient to drive alloy dopants into solid solution;
   quenching the integrated circuit;
   performing a chemical mechanical polish on the integrated circuit to remove portions of the aluminum based alloy; and
   performing a second anneal operation on the integrated circuit after performing the chemical mechanical polish process at a temperature sufficient to drive alloy dopants out of solid solution.

14. The method of claim 13 wherein the first anneal operation is performed at approximately 400 to 500° C.

15. The method of claim 13 wherein the second anneal operation is performed at approximately 100 to 250° C.

16. A method of fabricating a metal structure in an integrated circuit, the method comprises:

fabricating a downwardly extending opening in an insulating material of the integrated circuit;

depositing a layer of metal alloy in the downwardly extending opening and over the insulating material, the metal alloy contains alloy dopant precipitates;

performing a first anneal of the integrated circuit to drive the alloy dopants into solid solution;

quenching the integrated circuit;

removing excess metal alloy deposited over the insulating material using a polish process; and performing a second anneal after the excess metal alloy is removed to allow the dopants to come out of solution and increase a conductivity of the metal alloy.

17. The method of claim 16 wherein the first anneal is performed at 400 to 500° C.

18. The method of claim 16 wherein the metal alloy comprises aluminum with alloy dopants of silicon and copper.

19. The method of claim 16 wherein the second anneal is performed at 150 to 250° C.

20. The method of claim 16 wherein the metal alloy is deposited using a physical vapor deposition technique.

21. The method of claim 16 further comprising:

forming an electrical contact region under the insulating material such that the electrical contact region is exposed by the downwardly extending opening.

22. A method of fabricating a metal structure in an integrated circuit, the method comprises:

fabricating a downwardly extending trench in an insulating material of the integrated circuit;

depositing a layer of metal alloy in the downwardly extending trench and over the insulating material, the metal alloy contains alloy dopant precipitates;

performing a first anneal of the integrated circuit to drive the alloy dopants into solid solution;

quenching the integrated circuit;

removing excess metal alloy deposited over the insulating material using a polish process; and performing a second anneal after the excess metal alloy is removed to allow the dopants to come out of solution and increase a conductivity of the metal alloy.

23. The method of fabricating a metal structure of claim 22 wherein the first anneal is performed at 400 to 500° C.

24. The method of fabricating a metal structure of claim 22 wherein the metal alloy comprises aluminum with alloy dopants of silicon and copper.

25. The method of fabricating a metal structure of claim 22 wherein the second anneal is performed at 150 to 250° C.

26. A method of fabricating a metal structure in an integrated circuit, the method comprises:

fabricating a downwardly extending opening in an insulating material of the integrated circuit;

fabricating a trench in the insulating material and over the downwardly extending opening;

depositing a layer of metal alloy in the trench, the downwardly extending opening and over the insulating material, the metal alloy contains alloy dopant precipitates;

performing a first anneal of the integrated circuit to drive the alloy dopants into solid solution;

quenching the integrated circuit;

removing excess metal alloy deposited over the insulating material using a polish process; and performing a second anneal after the excess metal alloy is removed to allow the dopants to come out of solution and increase a conductivity of the metal alloy.

27. The method of claim 26 wherein the first anneal is performed at 400 to 500° C.

28. The method of claim 26 wherein the metal alloy comprises aluminum with alloy dopants of silicon and copper.

29. The method of claim 26 wherein the second anneal is performed at 150 to 250° C.

30. The method of claim 26 wherein the metal alloy is deposited using a physical vapor deposition technique.

31. The method of claim 26 further comprising:

forming an electrical contact region under the insulating material such that the electrical contact region is exposed by the downwardly extending opening.

* * * * *